United States Patent
Marsollek

(10) Patent No.: US 10,386,732 B2
(45) Date of Patent: Aug. 20, 2019

(54) BEARING ASSEMBLY FOR A LITHOGRAPHY SYSTEM, AND LITHOGRAPHY SYSTEM

(71) Applicant: Carl Zeiss SMT GmbH, Oberkochen (DE)

(72) Inventor: Pascal Marsollek, Berlin (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/181,437

(22) Filed: Nov. 6, 2018

(65) Prior Publication Data

US 2019/0079417 A1   Mar. 14, 2019

Related U.S. Application Data

(63) Continuation of application No. PCT/EP2017/060371, filed on May 2, 2017.

(30) Foreign Application Priority Data

May 10, 2016   (DE) .................. 10 2016 208 008

(51) Int. Cl.
*G03F 7/20* (2006.01)
*F16C 11/12* (2006.01)
(Continued)

(52) U.S. Cl.
CPC .......... *G03F 7/70816* (2013.01); *F16C 11/12* (2013.01); *G02B 7/02* (2013.01);
(Continued)

(58) Field of Classification Search
CPC ............. G03F 7/70816; G03F 7/70825; G03F 7/70725
(Continued)

(56) References Cited

U.S. PATENT DOCUMENTS

| 2004/0008331 | A1* | 1/2004 | Cox | ................ B23Q 1/58 355/53 |
| 2009/0040638 | A1 | 2/2009 | Van Deuren et al. | |

(Continued)

FOREIGN PATENT DOCUMENTS

| DE | 10 2011 004 607 A1 | 1/2012 |
| DE | 10 2011 088 735 A1 | 6/2012 |

(Continued)

OTHER PUBLICATIONS

Translation of International Search Report for corresponding PCT Appl No. PCT/EP2017/060371, dated Jul. 27, 2017.

*Primary Examiner* — Hung Nguyen
(74) *Attorney, Agent, or Firm* — Fish & Richardson P.C.

(57) ABSTRACT

The disclosure relates to a bearing assembly for a lithography system, having an optical element, a base, and a bearing device that moveably supports the optical element relative to the base. The bearing device has at least one torsion decoupling element that reduces a transmission of torsional moments between the optical element and the base. The torsion decoupling element has at least two leaf springs which have respective opposing narrow sides and which bring about torsional moments about an axis perpendicular to the narrow sides. The at least two leaf springs are also positioned at an angle to one another and are coupled to one another in such a way that a force flow through the torsion decoupling element simultaneously flows through the at least two leaf springs.

20 Claims, 12 Drawing Sheets

(51) Int. Cl.
  *G02B 7/02* (2006.01)
  *G02B 7/182* (2006.01)
(52) U.S. Cl.
  CPC ......... *G02B 7/182* (2013.01); *G03F 7/70825* (2013.01); *F16C 2370/20* (2013.01); *F16C 2370/22* (2013.01)
(58) Field of Classification Search
  USPC .............................................. 355/67, 72–76
  See application file for complete search history.

(56) References Cited

U.S. PATENT DOCUMENTS

2013/0314681 A1    11/2013   Erath et al.
2015/0198892 A1     7/2015   Hauf

FOREIGN PATENT DOCUMENTS

DE    10 2011 004 299 A1    8/2012
DE    10 2012 221 831 A1    6/2014

\* cited by examiner

BEARING ASSEMBLY FOR A LITHOGRAPHY SYSTEM, AND LITHOGRAPHY SYSTEM

CROSS-REFERENCE TO RELATED APPLICATIONS

The present application is a continuation of, and claims benefit under 35 USC 120 to, international application PCT/EP2017/060371, filed May 2, 2017, which claims benefit under 35 USC 119 of German Application No. 10 2016 208 008.3, filed May 10, 2016. The entire disclosure of these applications are incorporated by reference herein.

FIELD

The present disclosure relates to a bearing arrangement for a lithography apparatus, and to a lithography apparatus including such a bearing arrangement.

BACKGROUND

Microlithography is used for producing microstructured components, such as for example integrated circuits. The microlithography process is carried out with a lithography apparatus including an illumination system and a projection system. The image of a mask (reticle) illuminated via the illumination system is in this case projected via the projection system onto a substrate (for example a silicon wafer) coated with a light-sensitive layer (photoresist) and arranged in the image plane of the projection system, in order to transfer the mask structure to the light-sensitive coating of the substrate.

Driven by the desire for ever smaller structures in the production of integrated circuits, currently under development are EUV lithography apparatuses that use light with a wavelength in the range of 0.1 nm to 30 nm, in particular 13.5 nm. In the case of such EUV lithography systems, because of the high absorption of light of this wavelength by most materials, reflective optical units, that is to say mirrors, are used instead of—as previously—refractive optical units, that is to say lens elements.

The mirrors may for example be fastened to a supporting frame (force frame) and be designed as at least partially manipulable, in order to allow a movement of a respective mirror in up to six degrees of freedom, and consequently a highly accurate positioning of the mirrors in relation to one another, in particular in the pm range. This allows changes in the optical properties that occur for instance during the operation of the lithography apparatus, for example as a result of thermal influences, to be compensated for.

For mounting the mirrors on the supporting frame, usually gravity compensation devices on the basis of permanent magnets (magnetic gravity compensators) are used, as described for example in DE 10 2011 088 735 A1. The compensation force generated by such a gravity compensation device acts counter to the weight of the mirror, and it corresponds substantially to the weight in terms of its absolute value.

By contrast, the movement of a respective mirror—in particular also in the vertical direction—is actively controlled by way of so-called Lorentz actuators. Such a Lorentz actuator includes an energizable coil and, at a distance from it, a permanent magnet. These together generate an adjustable magnetic force for controlling the movement of the respective mirror. By way of example, such Lorentz actuators are described in DE 10 2011 004 607.

Both the gravity compensation devices and the Lorenz actuators contact the corresponding mirror via bearing devices. Here, it was found to be problematic that the numerical aperture of EUV projection systems, in particular, increasingly increases, leading to larger mirror surfaces and hence higher mirror masses. In turn, this means a higher mechanical load on the aforementioned bearing devices. This could be accounted for by elements of the bearing device having a more stable embodiment, in particular with greater material cross sections. However, this may be disadvantageous, in turn, in view of parasitic forces and the only restricted installation space available.

SUMMARY

The present disclosure seeks to provide an improved bearing arrangement for a lithography apparatus and also an improved lithography apparatus.

Accordingly, provision is made of a bearing arrangement for a lithography apparatus, including an optical element, a base and a bearing device. The optical element is movably mounted relative to the base. The bearing device has at least one torsion-decoupling element which reduces a transmission of torsional moments between the optical element and the base. The torsion-decoupling element has at least two leaf springs, which each have mutually opposing narrow sides. The torsional moments act about an axis that is perpendicular to the narrow sides. Further, the at least two leaf springs are at an angle to one another and coupled to one another in such a way that a force flow through the torsion-decoupling element simultaneously flows through both leaf springs.

As described at the outset, an actuation of optical elements with higher masses involves a reinforcement of elements of the bearing device. Typically, the diameters of such bearing elements increase in the process. The present disclosure is based, inter alia, on the discovery that the torsional stress increases as a result of warping torsion in the case of increasing diameters of bearing elements of the bearing device. As a result of using a torsion-decoupling element, it is now possible to reduce, ideally avoid, a transmission of torsional moments between the optical element and the base. Accordingly, parasitic forces are avoided and bearing elements of the bearing device can be designed to be less stable as they need not absorb torsional moments. These further elements include, in particular, one or more bending decoupling elements and one or more pins. The bending decoupling elements are embodied, in particular, as flexure bearings. The torsion stress in the bearing elements of the bearing device could also be reduced overall by a lengthening of the bearing device. However, this would lead to an increase in the installation space; however, this is advantageously avoided by way of the above-described torsion-decoupling element. Moreover, a lengthening of the bearing device would lead to a greater mass of same, in particular of a corresponding pin, which in turn increases parasitic dynamics.

Preferably, a respective one of the at least two leaf springs has four narrow sides, which in each case lie opposite one another in pairs. The four narrow sides frame a pair of opposite end sides. Expressed differently, a respective one of the at least two leaf springs has the shape of a rectangular plate. Equally, other forms of the at least two leaf springs are also conceivable. By way of example, one or more narrow sides of a respective leaf spring can have an arcuate profile.

As a result of the torsional moments acting about an axis that is perpendicular to the narrow sides, the torsion-decoupling element is torsionally weak. This is because the narrow sides only have a low planar moment of inertia about the axis.

The at least two leaf springs being at an angle to one another and being coupled to one another in such a way that the force flow through the torsion-decoupling element simultaneously flows through both springs ensures that the torsion-decoupling element is flexurally stiff about two axes, which are both perpendicular to one another and perpendicular to the axis about which the torsional moments act. What this achieves is that the torsion-decoupling element only has one degree of freedom, namely the rotational decoupling, while the two other rotational degrees of freedom and the three other translational degrees of freedom are locked; i.e., there is no relative movement within the torsion-decoupling element about one of the other two rotational axes or along any of the three translational axes. In the present case, the axis about which the torsional moments act is also referred to as a first axis; the two other axes are referred to as a second and third axis.

The aforementioned rotation decoupling can be achieved, in principle, by virtue of the at least two leaf springs being bent (variant 1) or twisted (variant 2) when the movement in the one the degree of freedom of the torsion-decoupling element occurs. In the present case, "angled" means nonparallel. By way of example, the two leaf springs are perpendicular to one another. In the present case, "perpendicular" (generally) preferably also includes deviations up to 20°, preferably up to 5° and more preferably up to 2°.

"Simultaneous" excludes those embodiments in which two leaf springs are arranged in succession such that the force flow initially flows through the corresponding first and, thereafter, through the corresponding second leaf spring. This is because precisely this leads to a flexibility about the respective leaf springs arising in each case As a result of the torsion-decoupling element consequently being embodied as a flexure bearing, advantages such as, for instance, minimal frictional losses, a very high positioning accuracy and good thermal transfer arise.

More than two leaf springs, for example 3 to 20 or 3 to 10 leaf springs, may also be installed in the torsion-decoupling element. Particularly preferably, provision is made of >4 leaf springs, in particular 6 to 8 leaf springs, which, for example, together can form the shape of a star when seen in cross section.

The base is preferably formed as a force frame.

According to one embodiment, the at least two leaf springs connect the same components of the bearing device to one another. The components can be—also exclusively—a first and a second component. The at least two leaf springs, referred to below as first and second leaf spring, connect the first and the second component to one another, wherein the connection is implemented each case via narrow sides of the leaf springs. Consequently, the first leaf spring is securely connected to the first component at a first narrow side and securely connected to the second component at a second narrow side, which lies opposite the first narrow side. The second leaf spring is securely connected to the first component at a first narrow side and securely connected to the second component at a second narrow side, which lies opposite the first narrow side. This embodiment can particularly easily ensure that the force flow through the torsion-decoupling element flows simultaneously through both leaf springs. "Simultaneously" relates to the time of the transmission of one and same torsional moment. Expressed differently, the first and second leaf spring are connected mechanically in parallel with one another.

According to a further embodiment, the at least two leaf springs together form the shape of a cross when seen in cross section. This embodiment is also referred to as a flexural pivot. Here, the at least two leaf springs can be arranged one behind the other along the one axis. Alternatively, the at least two leaf springs can be arranged with complete or partial overlap along the one axis. In particular, the at least two leaf springs can be fastened to one another along the one axis; they can also be formed integrally with one another.

According to a further embodiment, provision is made of more than two leaf springs, which together form the shape of a star when seen in cross section. What was already stated in respect of the shape of the cross applies accordingly here. By way of example, the leaf springs can be arranged in relation to one another at an angle of $$\frac{360°}{N},$$

where N corresponds to the number of leaf springs multiplied by 2.

According to a further embodiment, the at least two leaf springs are manufactured from a metal. Preferably, the at least two leaf springs are manufactured integrally with one another and/or with the first and/or second component.

According to a further embodiment, the torsion-decoupling element has two hollow cylindrical portions. A tongue can be formed at a respective hollow cylindrical portion, the tongue protruding into the respective other hollow cylindrical portion. A respective tongue can be connected to a respective other hollow cylindrical portion by way of both of the at least two leaf springs. In this embodiment, a hollow cylindrical portion with an assigned tongue forms a first component within the aforementioned meaning and the other hollow cylindrical portion with the tongue assigned thereto forms the second component within the aforementioned meaning. Additionally, provision could be made of, e.g., a third leaf spring, which is arranged centrally between the first and the second leaf spring in the longitudinal direction and which connects both a hollow cylindrical portion and the tongue assigned to the latter to the other hollow cylindrical portion and the tongue assigned to the latter. Here, the third leaf spring is perpendicular to the first and second tongue. The advantage of the third leaf spring consists in the instantaneous center moving less strongly under load and consequently the stiffness of the torsion-decoupling element varying less strongly under load.

According to a further embodiment, the bearing arrangement has at least one actuator, which is configured to actuate the optical element along the axis via the bearing device. The torsion-decoupling element has a high stiffness along this axis. Accordingly, large forces can be exerted by the actuator onto the optical element in a direction along the axis; this is desirable, particularly from considerations of the dynamics.

According to a further embodiment, the bearing device has at least one pin, the longitudinal central axis of which defines the axis. Forces are preferably transmitted through the pin along the longitudinal central axis thereof—in particular only along the longitudinal central axis. The rod can be connected to the optical element via one or more flexure bearings in such a way that the force transmission only along the longitudinal central axis is ensured.

According to a further embodiment, the pin is connected to the optical element via a first bending decoupling element, wherein the first bending decoupling element has at least two leaf springs, the bending axes of which are perpendicular to one another, and wherein a force flow through the first bending decoupling element flows through the at least two leaf springs in succession. This ensures that, advantageously, no relevant bending moments are transmitted via the bearing device. "In succession" means that the force flow initially flows through the one of the at least two leaf springs and then through the respective other leaf spring of the at least two leaf springs, to be precise for one and the same bending moment. As a result of the "connection in series"—in contrast to the "connection in parallel"—of the leaf springs like in the torsion joint, the flexibility about the two bending axis perpendicular to one another is reached.

According to a further embodiment, the at least one pin is movable along the axis via the at least one actuator. According to a further embodiment, the at least one pin has at its one end at least one first bending decoupling element. At its other end, the pin is coupled to the at least one actuator.

According to a further embodiment, the at least one pin is coupled at its other end to the at least one actuator via a second bending decoupling element, wherein the second bending decoupling element has at least two leaf springs, the bending axes of which are perpendicular to one another, and wherein a force flow through the second first bending decoupling element flows through the at least two leaf springs in succession. Advantageously, the pin thus can act as an extension, leading to the effect that a small change in angle within the respective bending decoupling elements leads to large movement of the optical element. As a result, it is possible, in turn, to minimize the mechanical loss power in the bending decoupling elements. Accordingly, there is a reduction in the thermal power losses, and so it is possible to dispense with additional precautions for cooling corresponding components for the purposes of preventing an unwanted thermal expansion.

According to a further embodiment, the actuator is a gravity compensator, a Lorentz actuator and/or a reluctance actuator.

In principle, the actuator can be formed as a passive and/or active actuator. "Passive" means that the actuator is configured to produce a quasi-static force. "Dynamic" means that the actuator is configured to produce a dynamic force.

A gravity compensator should be understood to mean a device that produces a compensation force that counteracts the weight of the optical element and substantially corresponds to the latter in terms of absolute value. By way of example, the gravity compensator may include a plurality of permanent magnets, in particular three or five permanent magnets. By way of example, the permanent magnets can be embodied as ring magnets. By way of example, the gravity compensator can have one or more permanent magnets, which are fastened to the base. Further, the gravity compensator can have one or more permanent magnets, which are fastened to the bearing device, in particular to the at least one pin. The interaction between these permanent magnets produces the compensation force.

A "Lorentz actuator" (voice coil actuator) should be understood to mean a coil that interacts with a magnet. By way of example, the coil can be attached to the base and the magnet, in particular a permanent magnet, can be attached to the bearing device, in particular to the at least one pin. An inverted arrangement is also possible.

A "reluctance actuator" should be understood to mean an actuator in which the actuation force is produced by a reluctance force. The latter employs the effect that a system strives for a minimal magnetic resistance (reluctance).

According to a further embodiment, the bearing device has a plurality of bearing units, which each include at least one pin, at least one actuator for actuating the pin along the longitudinal axis thereof and at least one torsion-decoupling element about the longitudinal axis. Each of the plurality of bearing units can be configured to actuate the optical element in exactly one degree of freedom. In each case, the actuation is implemented along the longitudinal direction of the pin. Advantageously, the plurality of bearing units contact the optical element in such a way that, overall, a movement of the optical element in two, three, four, five or six degrees of freedom is achieved. The six degrees of freedom include the three rotational and the three translational degrees of freedom.

According to a further embodiment, provision is preferably made of between two and nine, preferably between six and nine, of the bearing units. As a result, the forces for actuating the optical element can be subdivided in advantageous fashion.

According to a further embodiment, the optical element is a mirror, a lens element, a lambda plate or an optical grating.

Furthermore, a lithography apparatus, in particular an EUV or a DUV lithography apparatus, including at least one bearing arrangement as described above is provided. EUV stands for "extreme ultraviolet" and refers to a wavelength of the operating light of between 0.1 and 30 nm. DUV stands for "deep ultraviolet" and refers to a wavelength of the operating light of between 30 and 250 nm.

The embodiments and features described for the proposed bearing arrangement are correspondingly applicable to the proposed lithography apparatus.

Further possible implementations of the disclosure also include not explicitly mentioned combinations of features or embodiments that are described above or below with respect to the exemplary embodiments. In this case, the person skilled in the art will also add individual aspects as improvements or supplementations to the respective basic form of the disclosure.

Further advantageous configurations and aspects of the disclosure are the subject matter of the dependent claims and also of the exemplary embodiments of the disclosure described below.

BRIEF DESCRIPTION OF THE DRAWINGS

In the text that follows, the disclosure is explained in more detail on the basis of preferred embodiments with reference to the accompanying figures, in which.

DESCRIPTION OF EXEMPLARY EMBODIMENTS

Identical elements or elements having an identical function have been provided with the same reference signs in the figures, unless indicated to the contrary. Insofar as a reference sign has a plurality of reference lines in the present case, this means that the corresponding element is present multiply. Reference sign lines pointing to concealed details are illustrated in a dashed manner. It should also be noted that the illustrations in the figures are not necessarily true to scale.

Figure 1A:
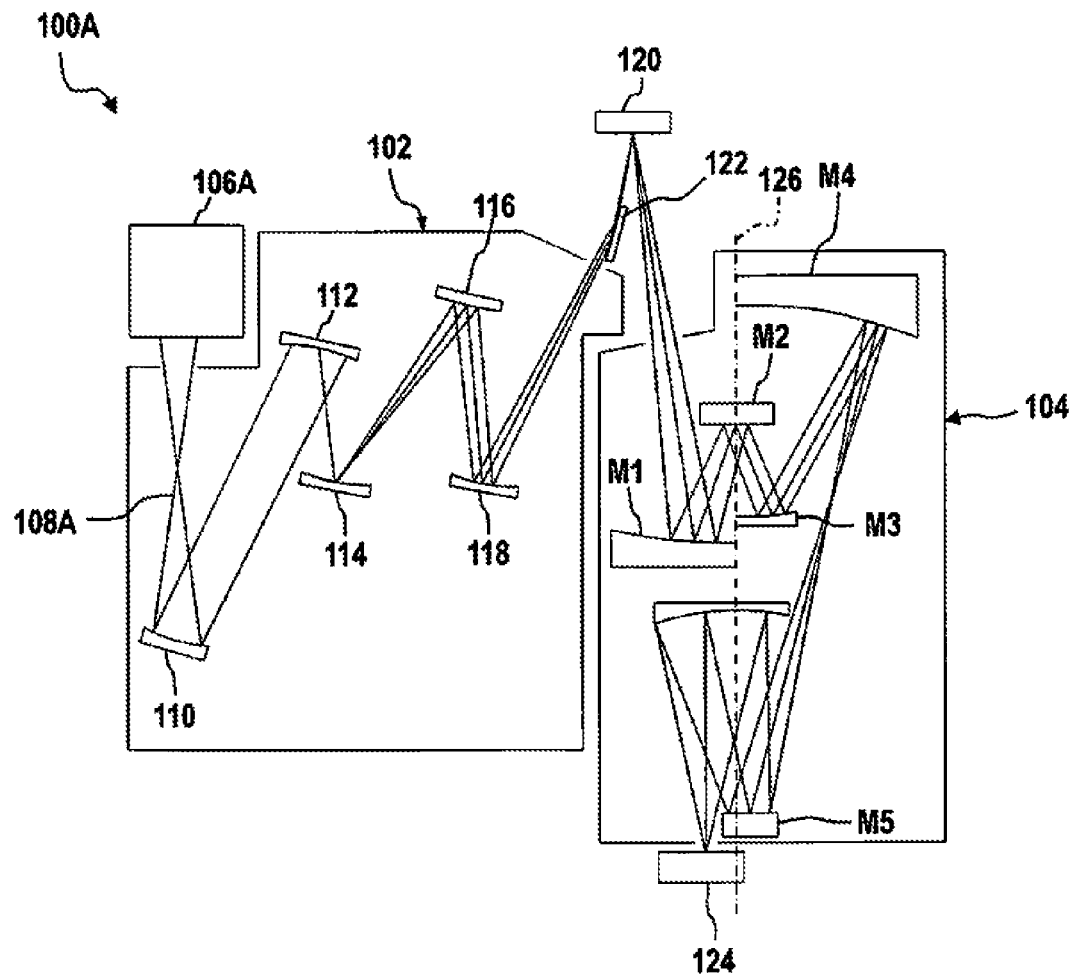
FIG. 1A shows a schematic view of an EUV lithography apparatus.

FIG. 1A shows a schematic view of an EUV lithography apparatus 100A, which includes a beam-shaping and illumination system 102 and a projection system 104. EUV stands for "extreme ultraviolet" and refers to a wavelength of the operating light of between 0.1 and 30 nm. The beam shaping and illumination system 102 and the projection system 104 are respectively provided in a vacuum housing (not shown), each vacuum housing being evacuated with the aid of an evacuation device (not shown). The vacuum housings are surrounded by a machine room (not shown), in which the drive appliances for mechanically moving or adjusting the optical elements are provided. Moreover, electrical controllers and the like can also be provided in this machine room.

The EUV lithography apparatus 100A includes an EUV light source 106A. A plasma source (or a synchrotron), which emits radiation 108A in the EUV range (extreme ultraviolet range), i.e., for example, in the wavelength range of 5 nm to 20 nm, may be provided, for example, as the EUV light source 106A. In the beam shaping and illumination system 102, the EUV radiation 108A is focused and the desired operating wavelength is filtered out from the EUV radiation 108A. The EUV radiation 108A generated by the EUV light source 106A has a relatively low transmissivity through air, for which reason the beam-guiding spaces in the beam-shaping and illumination system 102 and in the projection system 104 are evacuated.

The beam shaping and illumination system 102 illustrated in FIG. 1A has five mirrors 110, 112, 114, 116, 118. After passing through the beam shaping and illumination system 102, the EUV radiation 108A is directed onto the photomask (reticle) 120. The photomask 120 is likewise formed as a reflective optical element and can be arranged outside the systems 102, 104. Furthermore, the EUV radiation 108A can be directed onto the photomask 120 via a mirror 122. The photomask 120 has a structure which is imaged onto a wafer 124 or the like in a reduced fashion via the projection system 104.

The projection system 104 (also referred to as projection lens) has six mirrors M1-M6 for imaging the photomask 120 onto the wafer 124. In this case, individual mirrors M1-M6 of the projection system 104 may be arranged symmetrically in relation to the optical axis 126 of the projection system 104. It should be noted that the number of mirrors of the EUV lithography apparatus 100A is not restricted to the number represented. A greater or lesser number of mirrors can also be provided. Furthermore, the mirrors, as a rule, are curved on their front side for beam shaping.

Figure 1B:
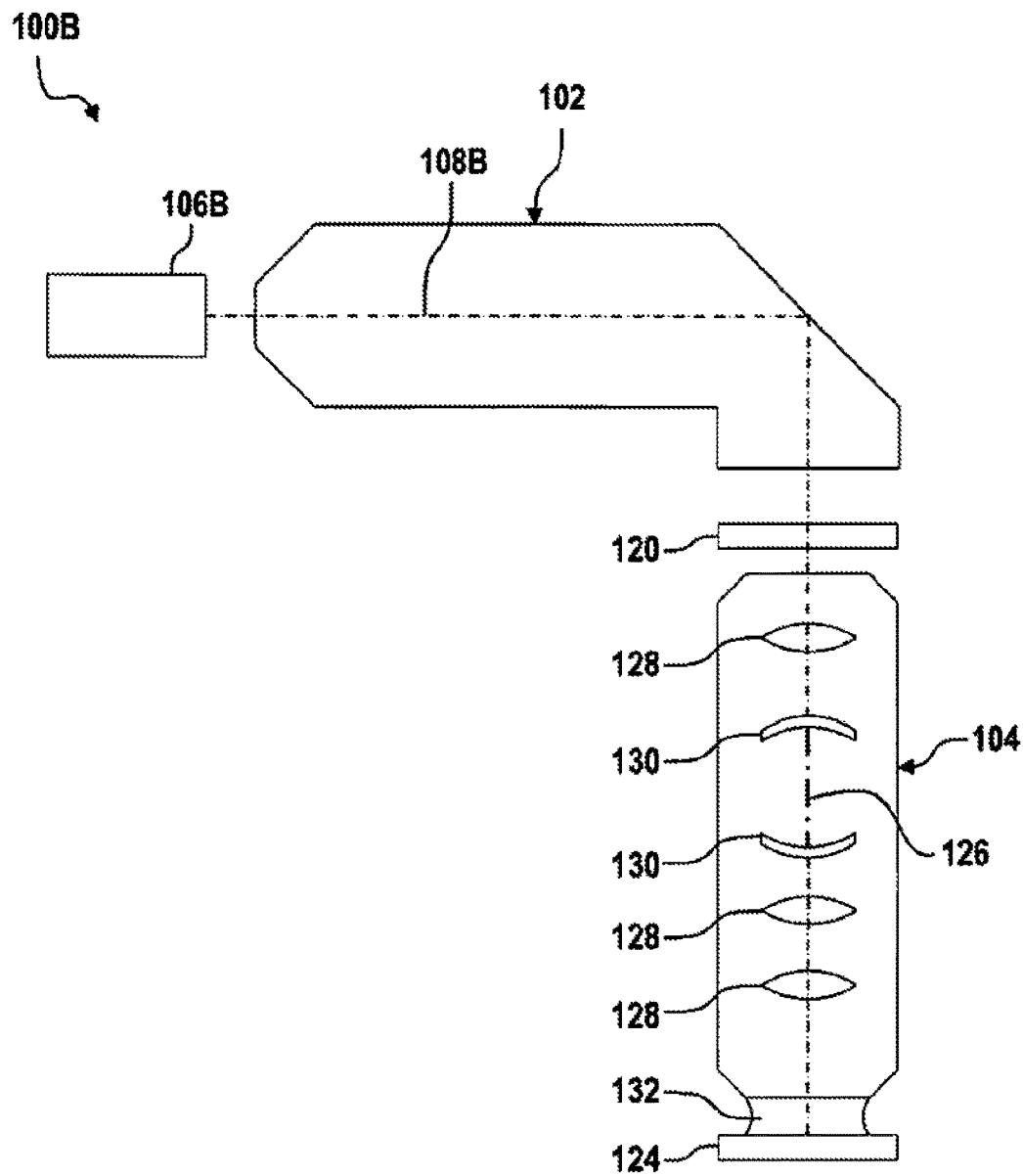
FIG. 1B shows a schematic view of a DUV lithography apparatus.

FIG. 1B shows a schematic view of a DUV lithography apparatus 100B, which includes a beam shaping and illumination system 102 and a projection system 104. DUV stands for "deep ultraviolet" and refers to a wavelength of the operating light of between 30 and 250 nm. As has already been described with reference to FIG. 1A, the beam shaping and illumination system 102 and the projection system 104 can be arranged in a vacuum housing and/or surrounded by a machine room with corresponding drive devices.

The DUV lithography apparatus 100B has a DUV light source 106B. By way of example, an ArF excimer laser that emits radiation 108B in the DUV range at 193 nm, for example, can be provided as the DUV light source 106B.

The beam shaping and illumination system 102 illustrated in FIG. 1B guides the DUV radiation 108B onto a photomask 120. The photomask 120 is embodied as a transmissive optical element and can be arranged outside the systems 102, 104. The photomask 120 has a structure which is imaged onto a wafer 124 or the like in a reduced fashion via the projection system 104.

The projection system 104 has a plurality of lens elements 128 and/or mirrors 130 for imaging the photomask 120 onto the wafer 124. In this case, individual lens elements 128 and/or mirrors 130 of the projection system 104 can be arranged symmetrically in relation to the optical axis 126 of the projection system 104. It should be noted that the number of lens elements and mirrors of the DUV apparatus 100B is not restricted to the number represented. A greater or lesser number of lens elements and/or mirrors can also be provided. Furthermore, the mirrors are generally curved on their front face for beam shaping.

An air gap between the last lens element 128 and the wafer 124 can be replaced by a liquid medium 132 which has a refractive index of >1. The liquid medium can be high-purity water, for example. Such a construction is also referred to as immersion lithography and has an increased photolithographic resolution.

Figure 2:
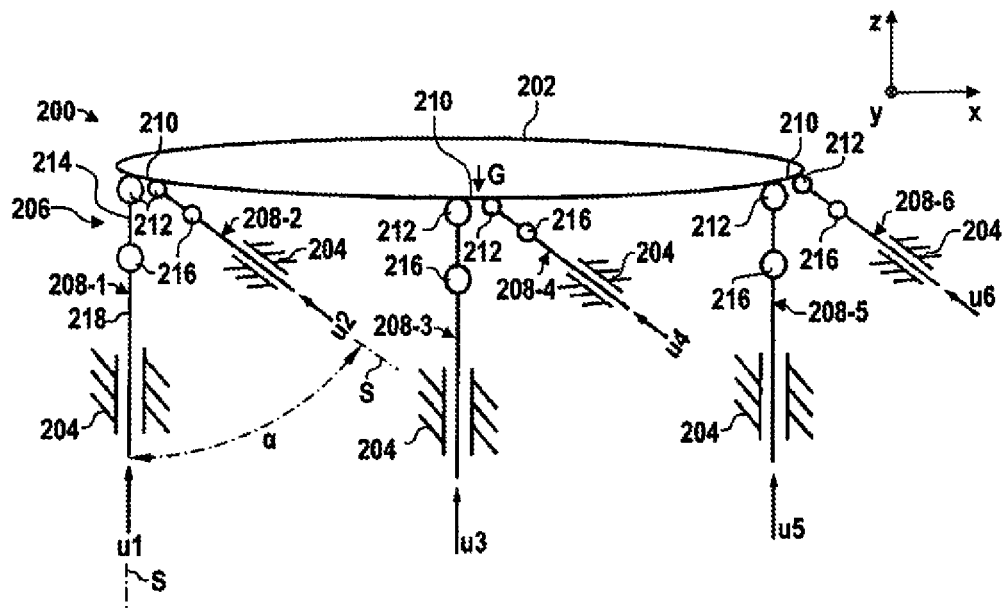
FIG. 2 shows a bearing arrangement that is known to the applicant internally.

FIG. 2 shows a schematic side view of a bearing arrangement 200 that is known to the applicant internally.

The bearing arrangement 200 includes an optical element 202. The optical element 202 can be one of the mirrors or one of the lens elements, which have been described in the context of FIGS. 1A and 1B. In particular, this is one of the mirrors M1-M6. Alternatively, the optical element 202 can also be an optical grating or a lambda plate.

Further, the bearing arrangement 200 includes a base 204. In particular, the base 204 can be a force frame of the lithography apparatus 100A, 100B. The base 204 can also be composed of a plurality of force frames that, in particular, are kinematically decoupled from one another.

Furthermore, the bearing arrangement 200 includes a bearing device 206 which, according to the exemplary embodiment, is composed of six bearing units 208-1 to 208-6. Here, the bearing units 208-1 to 208-6 are subdivided into three bearing units 208-1, 208-3, 208-5, via which there is gravity compensation and an active actuation of the mirror 202, and three bearing units 208-2, 208-4, 208-6, via which there only is an active actuation of the mirror 202.

Figure 2A:
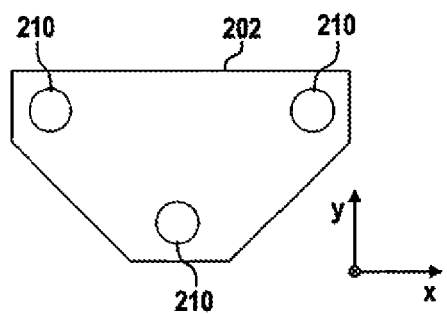
FIG. 2A schematically shows a plan view of an optical element from FIG. 2.

The bearing units 208-1 to 208-6 contact the mirror 202 in pairs by way of an adapter 210 that is assigned to the respective pair and illustrated in FIG. 2A. Here, the adapters 210 lie, for example, at the corners of an imaginary triangle in the plan view (see FIG. 2A) on the mirror 202 from FIG. 2.

Via the actuators u1-u6, it is possible to exert a force on a respective bearing unit 208-1 to 208-6, which, in turn, introduces the force into the mirror 202 in each case by way of a respective adapter 210 and, as a result thereof, move the mirror. The movement of the mirror 202 is implemented for optical correction purposes, in particular. In particular, this optical correction may include a correction of imaging aberrations on the wafer 124.

The actuators u1, u3, u5 are preferably each embodied as a combined gravity compensator/Lorentz actuator and each produce a quasi-static force in the z-direction, i.e., in the vertical direction, which is directed counter to gravity G acting on the mirror 202. Here, in terms of absolute value, the sum of the quasi-static forces produced by the gravity compensators u1, u3, u5 corresponds to the gravitational force G, and so the mirror 202 is kept levitated.

A respective actuator u1, u3, u5 may include a plurality of permanent magnets. Here, the permanent magnets are configured to produce a suitable quasi-static holding force without the supply of external energy. Further, each actuator u1, u3, u5 includes one or more electrical coils for producing a dynamic force (Lorentz force or reluctance force) for actively actuating the mirror 202 in the z-direction By contrast, the actuators u2, u4, u6 can be embodied as (pure) Lorentz actuators, for example. Here, they produce a force that is oriented at an angle to the z-direction. By way of example, a corresponding angle a can be between 20 and 70°, preferably between 40 and 60°. There is an active actuation of the mirror 202 via the Lorentz actuators u2, u4, u6.

Now, in particular, a respective bearing unit 208-1 to 208-6 can have the structure described in the following text. The structure is explained below for the bearing unit 208-1 in an exemplary fashion; however, it applies accordingly to the other bearing units 208-2 to 208-6.

The bearing unit 208-1 includes a first bending decoupling element 212, which is connected, firstly, to the assigned adapter 210 and, secondly, to a first pin 214. The first pin 214, in turn, is coupled to a second pin 218 via a second bending decoupling element 216. The actuator u1 is connected to the second pin 218 and actuates the latter. Here, the actuator u1 is configured to apply a force onto the pin along the direction in which the latter extends; this is identical to the z-direction in this case. The actuator u1 can be composed of parts which are fastened, firstly, to the second pin 218 and, secondly, to the base 204, for example made of magnets and coils.

The bending decoupling elements 212, 216 each provide flexibility in two degrees of freedom, namely a rotation about two axes, which are each perpendicular to the pin axis S of the respective pins 214, 218 and which are perpendicular to one another.

The so-called Grübler's equation serves to describe the mobility of mechanisms. In its most general form, the equation is:

$$F = T \cdot (n - 1 - g) + \sum_{i=1}^{g} b_i,$$

where:
F denotes the number of degrees of freedom, T denotes type of the mechanism (T=6 for a spatial mechanism, T=3 for a spherical or plane mechanism), n denotes the number of mechanism members, g denotes the number of joints, and $b_i$ denotes mobility of an individual joint i ($b_i$=1, 2, . . . ).

If Grübler's equation is now applied to the mechanism of FIG. 2, the following arises:

$$F_{mirror} = 6 \cdot (2 \cdot 6 + 2 - 1) - (6-2) \cdot 2 \cdot 6 - (6-1) \cdot 1 \cdot 6 = 78 - 48 - 30 = 0$$

What emerges from this is that the mirror 202 in fact does not have any degree of freedom and hence is mounted in a statically determined fashion. However, reality shows that the mirror 202 is movable in all six degrees of freedom. This can be traced back to the fact that the flexure bearings usually used for the bending decoupling elements 212, 216 have a resilience in the torsional direction, i.e., about the pin axis S.

Figure 3:
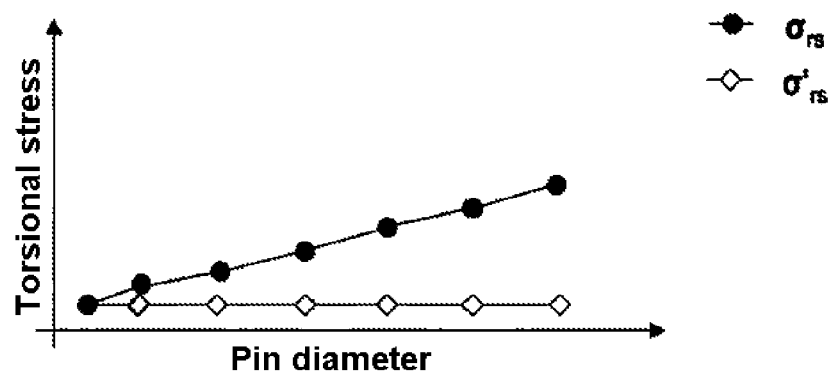
FIG. 3 shows, for a pin from FIG. 2, a diagram of the torsional stress in bending decoupling elements against the diameter of the pin.

Microlithographic processes for producing ever smaller structures involve an increase in the numerical aperture of projection systems 104, as shown in FIGS. 1A and 1B. Increasing the numerical aperture involves larger mirror surfaces and hence also greater mirror masses. The quasi-static hold of such masses and the dynamic movement thereof leads, in turn, to higher forces that, via the bearing device 206 or the respective bearing units 208-1 to 208-6, have to be applied to the mirror 202 by the actuators u1 to u6. Accordingly, the actuators u1 to u6 have to be designed to be stronger, as a result of which the mass thereof increases. This, in turn, has as a consequence that, in order to obtain the same natural frequencies, the axial stiffness of the pins 214, 218 and of the bending decoupling elements 212, 216 is increased, for the purposes of which the cross sections thereof are increased. In particular, there is an increase in the torsional stress $\sigma_{rs}$ in the bending decoupling elements 212, 216, the torsional stress already having a relatively high value in the bearing arrangement 200 according to FIG. 2. This is shown in FIG. 3. Additionally, reference is made to the fact that, in reality, the pin 218 may also be embodied to be very short or else in the form of another component.

Figure 4:
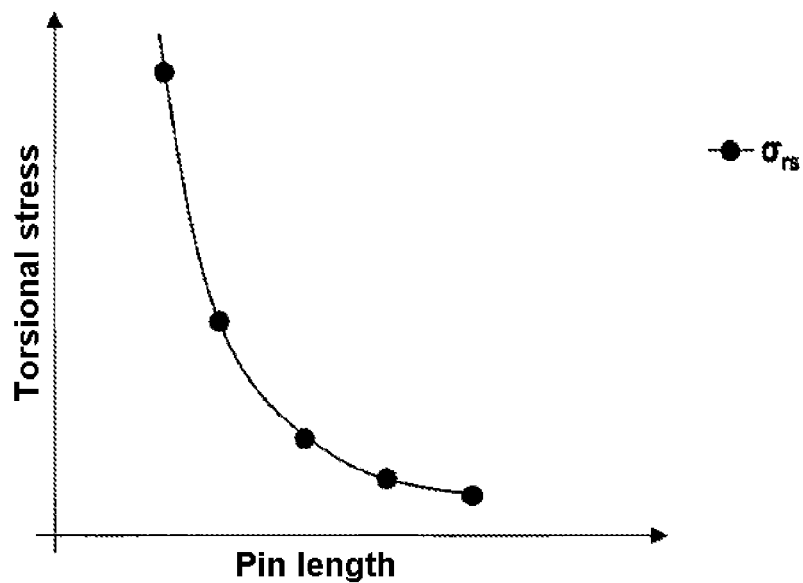
FIG. 4 shows, for a pin from FIG. 2, the torsional stress in the bending decoupling elements against the length of the pin.

FIG. 4 shows the torsional stress $\sigma_{rs}$ in the bending decoupling elements 212, 216 from FIG. 2 as a function of the pin length of the pin 214. It shows that the torsional stress in the bending decoupling elements 212, 216 could be reduced by lengthening the latter. However, this disadvantageously leads to an increase in the installation space.

Figure 5:
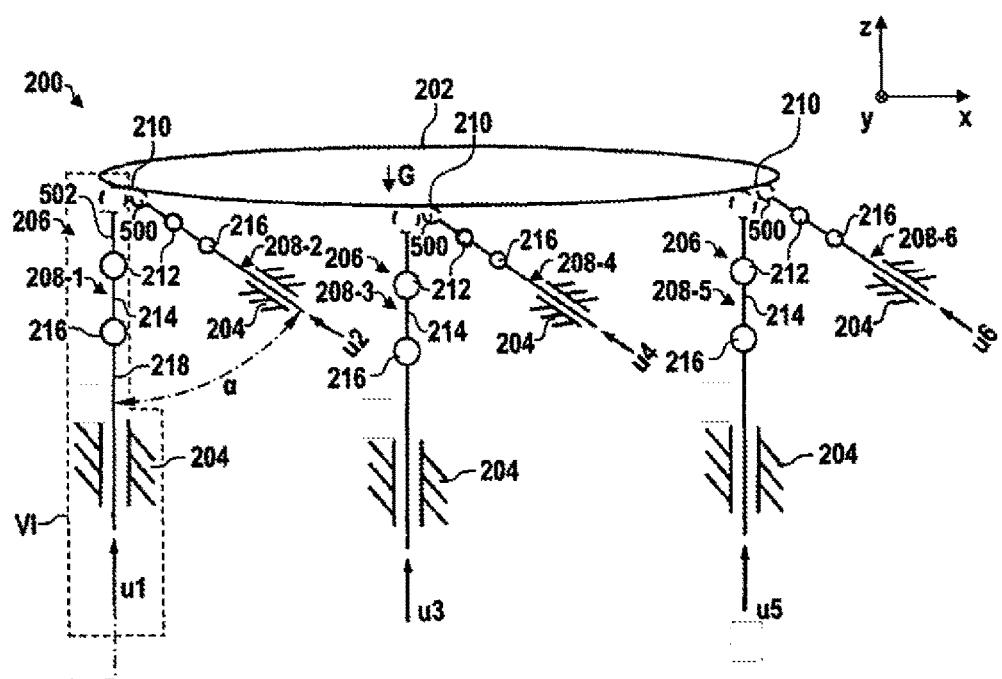
FIG. 5 shows a bearing arrangement according to a first exemplary embodiment of the disclosure.

FIG. 5 now shows an embodiment of the bearing arrangement 200, in which the torsional stress $\sigma'_{rs}$ in the bearing device 206 or in the respective bearing units 208-1 to 208-6 and hence in the bending decoupling elements 212, 216 has been reduced significantly in relation to the solution according to FIG. 2, in particular to virtually zero. This is achieved by virtue of a torsion-decoupling element 500 being inserted into the respective bearing unit 208-1 to 208-6.

By way of example, the torsion-decoupling element 500 can be inserted between the first bending decoupling element 212 and the mirror 202. To this end, the torsion-decoupling element 500 can be connected, firstly, to an assigned adapter 210 and, secondly, to a third pin 502. The pin 502, in turn, is connected to the first bending decoupling element 212. In principle, any other position of the torsion-decoupling element 500 in the bearing unit 208-1 is equally conceivable. Later, such a variant is still explained in conjunction with FIG. 6.

The torsion-decoupling element 500 admits a rotation about the pin axis S, and so no torsional loads, or no relevant torsional loads, are transmitted about the pin axis S to the base 204. A corresponding statement also applies to the bearing units 208-2 to 208-6.

Grübler's equation for the bearing arrangement 200 from FIG. 5 is as follows:

$$F_{mirror}=6\cdot(3\cdot6+2-1)-(6-2)\cdot2\cdot6-(6-1)\cdot2\cdot6=114-48-60=6$$

Consequently, the mirror 202 in the bearing arrangement 200 according to FIG. 5 in fact has the six desired degrees of freedom. That is to say, a movement of same in the six degrees of freedom is implemented without a relevant torsional stress being produced in the bearing device 206.

Figure 5A:
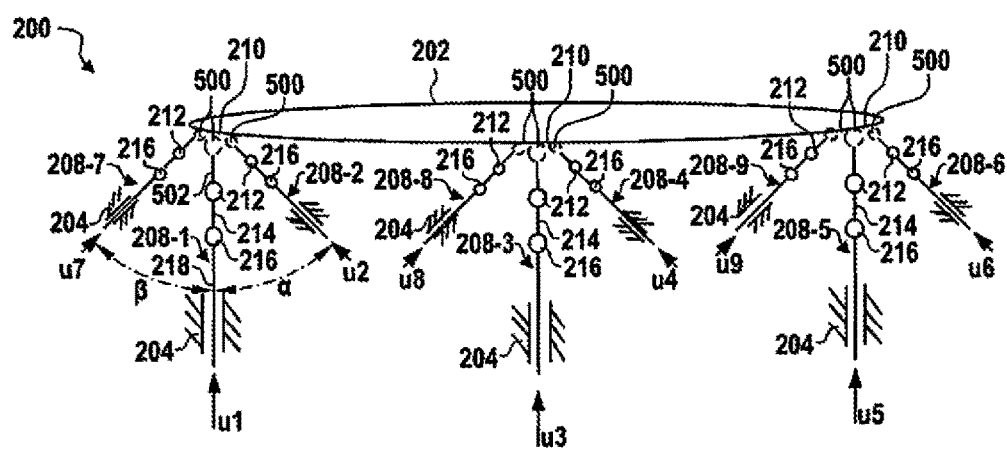
FIG. 5A shows a bearing arrangement according to a second exemplary embodiment of the disclosure.

FIG. 5A shows a variant of the bearing arrangement 200, which differs from the arrangement according to FIG. 5 in that an additional bearing unit 208-7, 208-8, 208-9, together with the respectively assigned actuator u7, u8 and u9, is provided for each adapter 210 (see FIG. 2A). The bearing unit 208-7 likewise holds the mirror 202 in a movable fashion in relation to the base 204. The actuator u7 is configured to apply a force onto the mirror 202 at an angle β. Here, the angle β can be chosen to equal the angle α. In particular, the bearing units 208-2 and 208-7 can be arranged in mirror symmetric fashion in relation to the pin axis S of the bearing unit 208-1.

The actuators u7 to u9 can each be embodied as Lorentz actuators. Further, these can be configured for active actuation, i.e., for applying dynamic forces to the mirror 202. In this case, the actuators u1, u3 and u5 can be pure gravity compensators, i.e., those actuators that are only designed to a quasi-static holding force, which corresponds to the weight of the mirror 202 to be absorbed, but are not configured to produce dynamic forces.

As shown in FIG. 5A, each of the bearing units 208-1 to 208-9 has a torsion-decoupling element 500. Consequently, no torsional loads, or no relevant torsional loads, are transmitted to the mirror 202 (or any other optical element in other embodiments) in this embodiment either.

In the variant according to FIG. 5A, too, the torsion-decoupling elements 500 can be arranged at any positions within the bearing units 208-1 to 208-9.

Figure 6:
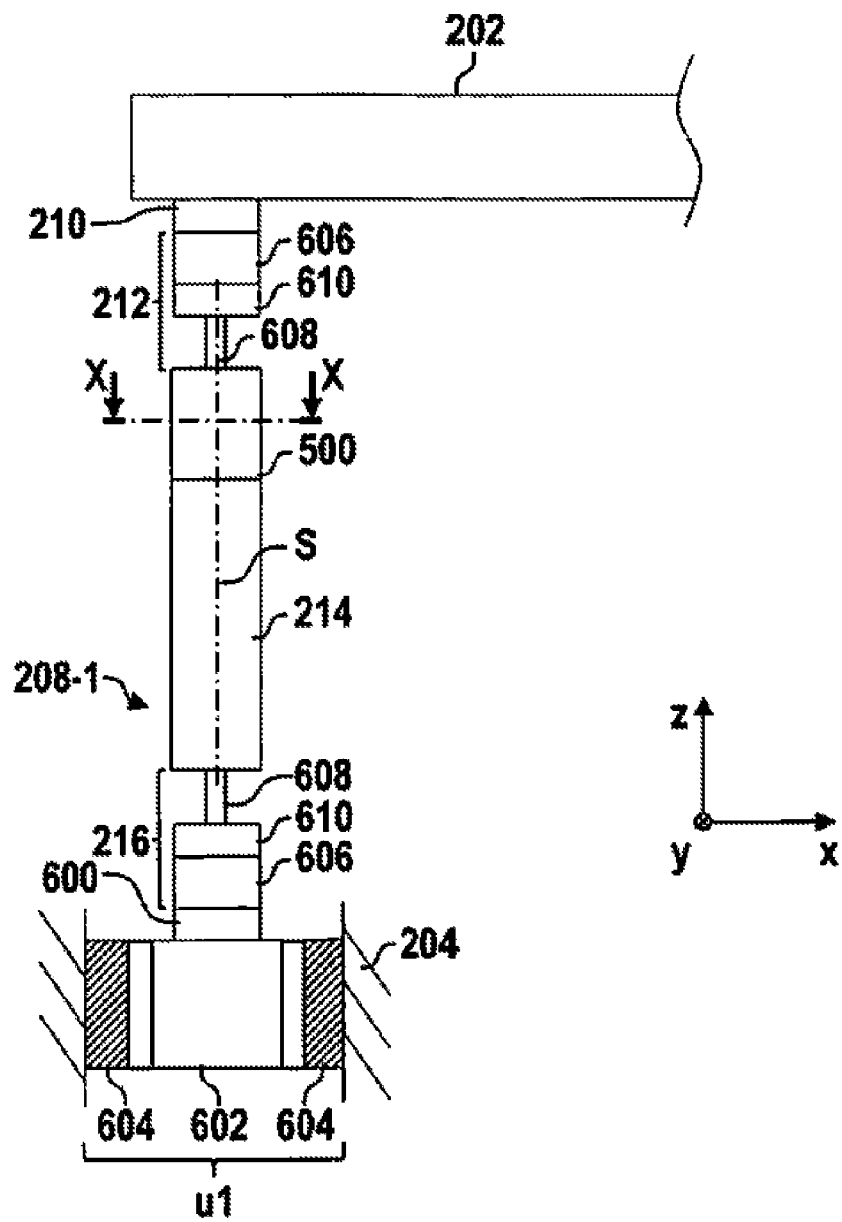
FIG. 6 shows a bearing unit in a portion VI from FIG. 5.

Below, a detailed illustration VI from FIG. 5, shown in FIG. 6, is used to explain a possible embodiment of part of the bearing arrangement 200 in more detail. Further, in this respect, reference is made to the perspective illustration of a portion of FIG. 6, which is shown in FIG. 7, and to the magnified details VIII and IX from FIG. 7 in FIGS. 8 and 9, respectively.

The bearing unit 208-1 includes the first bending decoupling element 212, which is connected, firstly, to the mirror 202 via the adapter 210. Secondly, the first bending decoupling element 212 is connected to the torsion-decoupling element 500. Opposite to the first bending decoupling element 212, the torsion-decoupling element 500 is connected to the pin 214. The pin 214, in turn, is connected via the second bending decoupling element 216 to the actuator u1 by way of an adapter 600. The actuator u1 includes a movable part 602 (the latter may be at least partly identical with the pin 218 in FIG. 5) and a stationary part 604. The movable part 602 is connected to the adapter 600. The stationary part 604 is connected to the base 204. By way of example, a plurality of permanent magnets and/or coils can be integrated into the movable and into the stationary part 602, 604, and so the actuator can be embodied as a passive and/or active actuator. In this context, it should be observed that, in principle, all above-described actuators u1-u9 may additionally or alternatively have one or more reluctance actuators.

Figure 7:
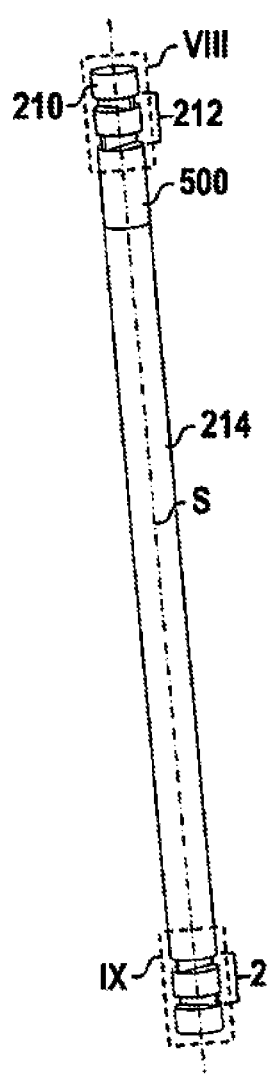
FIG. 7 shows part of the bearing unit from FIG. 6 in a perspective illustration.
Figure 8:
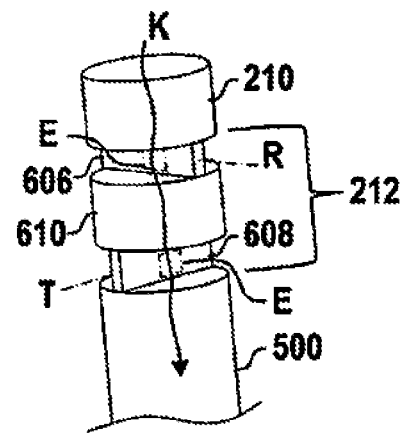
FIG. 8 shows a magnified view VIII from FIG. 7.
Figure 9:
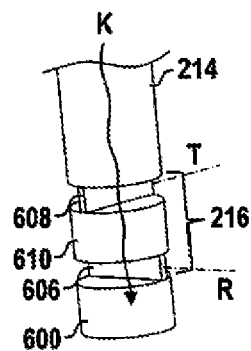
FIG. 9 shows a magnified view IX from FIG. 7.

The first bending decoupling element 212 can be seen in perspective in FIGS. 7 and 8. It includes two leaf springs 606, 608, which are connected to one another via a connection portion 610. The leaf springs 606, 608 and the connection portion 610 can be manufactured as an integral component, in particular from metal.

Figure 8A:
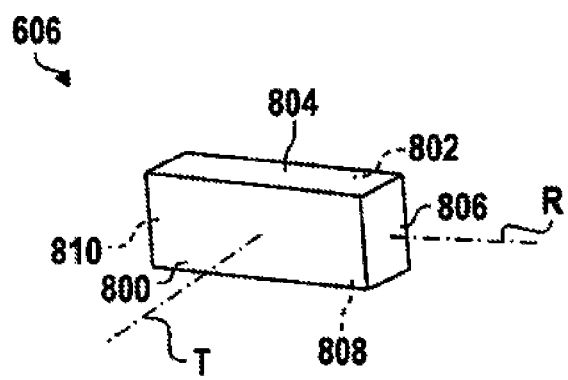
FIG. 8A shows a perspective view of a leaf spring from FIG. 8.

Each of the leaf springs 606, 608 has a plane E of principal extent. The planes E of principal extent are perpendicular to one another. Thus, for example, in the non-deflected state of the bearing unit 208-1, a perpendicular to the plane E of principal extent of the leaf spring 606 can point in the y-direction and a perpendicular to the plane E of principal extent of the leaf spring 608 can point in the x-direction; see also FIG. 6. Consequently, the first bending decoupling element 212 has a flexibility that allows the pin 214 to pivot both about the x- and about the y-axis. The x- and y-axis are perpendicular to one another and are each perpendicular to the z-axis. The corresponding bending axes of the leaf springs 606, 608 are denoted by R and T and may, as mentioned previously, coincide with the axes x and y. As explained in an exemplary manner here for the leaf spring the 606 on the basis of FIG. 8A, a respective leaf spring 606, 608 has two opposing wide sides 800, 802 and four narrow sides 804, 806, 808 and 810. The opposing long narrow sides 804, 808 point in the direction of the pin axis S (non-deflected state of the mirror 202). The short narrow sides 806, 810 point in the direction of the bending axis R. The mutually opposing wide sides 800, 802 point in the direction of the bending axis T. These explanations made in relation to the first leaf spring 606 apply accordingly to the second leaf spring 608.

A force flow K through the first bending element 212 flows successively through the two leaf springs 606, 608, as shown in FIG. 8. That is to say, the leaf springs 606, 608 are mechanically connected in series. This causes the aforementioned flexibility to be provided about two mutually orthogonal axes, namely the axes R and T in this case.

The first bending decoupling element 212 is arranged at the mirror-side end of the pin 214 or at the mirror-side end of the torsion-decoupling element 500. Opposite thereto, the second bending decoupling element 216 is arranged at the other end of the pin 214. The second bending decoupling element has an identical construction to the first bending joint 212, the construction being shown in FIG. 9.

On account of this arrangement of the first and the second bending decoupling elements 212, 216 and of the (long) pin 214 situated therebetween, the pin preferably containing the torsion-decoupling element 500 (any other position of the torsion-decoupling element 500 within the bearing device 206 is also possible), it is possible to bring about a movement of the mirror 202 which, even for large travels, only leads to small bends in the leaf springs 606, 608 in the first and second bending decoupling element 212, 216. This is advantageous, particularly in the view of consequently only little heat being released there, the heat, in turn, possibly having a damaging effect in the form of thermal expansions.

Figure 10A:
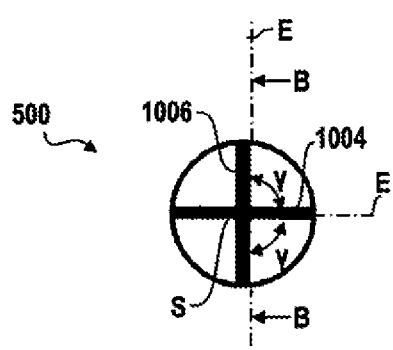
FIG. 10A shows a section X-X through a torsion-decoupling element from FIG. 6.
Figure 10B:
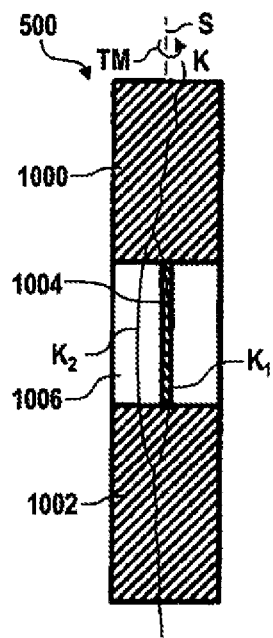
FIG. 10B shows a section B-B from FIG. 10A.

The structure of the torsion-decoupling element 500 is explained in more detail on the basis of FIG. 10A, which shows a section X-X from FIG. 6, and FIG. 10B, which shows a sectional view B-B from FIG. 10A. Here, FIGS. 10A and 10B represent a possible embodiment.

The torsion-decoupling element 500 includes a first connection portion 1000 and a second connection portion 1002. Further, the torsion-decoupling element 500 includes a first leaf spring 1004 and a second leaf spring 1006.

Figure 10C:
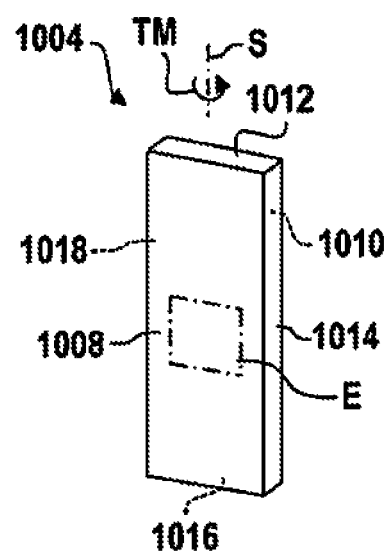
FIG. 10C shows a perspective view of a leaf spring from FIG. 10A.

The leaf spring 1004 is illustrated in a perspective view in FIG. 10C in exemplary fashion. It includes opposing wide sides 1008 and 1010 and four narrow sides 1012, 1014, 1016, 1018. A pair of opposing narrow sides 1012, 1016 in this case points in the direction of the pin axis S (in the non-deflected state of the mirror 202). The first leaf spring 1004 is connected, in particular integrally connected, to the first connection portion 1000 and the second connection portion 1002 via these narrow sides. The second leaf spring 1006 has a corresponding structure. However, the planes E of principal extent of the first and second leaf spring 1004, 1006 are angled to one another, in particular perpendicular to one another, as shown.

A force flow K (see FIG. 9) through the torsion-decoupling element 500 is split into two partial flows $K_1$ and $K_2$ during the transition from the connection portions 1000, 1002 to the leaf springs 1004, 1006. Then, these flow parallel to one another and flow simultaneously through the leaf springs 1004, 1006 and merge together thereafter again; see FIG. 10B. Accordingly, the leaf springs 1004, 1006 are mechanically connected in parallel. What emerges therefrom is that the one leaf spring 1004, 1006 cannot be bent without also bending the respective other leaf spring 1004, 1006 at the same time. Since the leaf springs are arranged at an angle to one another, a corresponding bending moment sees a large planar moment of inertia. As shown in FIG. 10A, this large planar moment of inertia emerges from the leaf springs 1004, 1006 having an arrangement in the shape of a cross in the cross section. Furthermore, the leaf springs according to the present embodiment are connected to one another, in particular integrally connected to one another, along the pin axis S.

Hence, the torsion-decoupling element 500 is flexurally stiff, in particular in relation to a bending moment about the axes R and T; see FIG. 8. Further, the torsion-decoupling element 500 is stiff along the pin axis S—as, incidentally, also the first and second bending coupling element 212, 216.

A torsional moment TM (see FIG. 10B) about the pin axis S (i.e., if the connection portions 1000, 1002 are twisted against one another about the axis S) leads to a distortion of the leaf springs 1004, 1006 (i.e., the leaf springs 1004, 1006 are twisted), since these are only have a very low torsional stiffness on account of their small cross section. Accordingly, no relevant torsional moment TM is guided through the leaf springs 1004, 1006.

By way of example, as shown, the leaf springs 606, 608, 1004 and 1006 can have a planar shape, in particular a rectangular planar shape. However, other geometries are also conceivable. In particular, a curved profile along the narrow sides 1014, 1018, in particular a partial circular profile, is conceivable.

Figure 11:
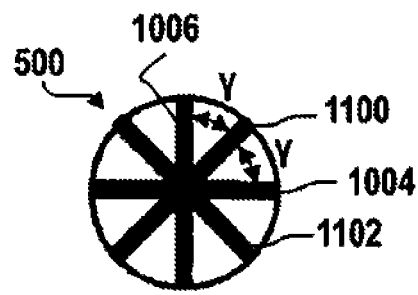
FIG. 11 shows the view from FIG. 10A, but according to a further embodiment.

FIG. 11 illustrates a torsion-decoupling element 500 in cross section, wherein this represents a variation in relation to FIG. 10A. The variation consists in a third and fourth leaf spring 1100, 1102 being provided, which are connected to the first and second connection portion 1000, 1002 at their respective opposite narrow sides 1012, 1016 (see FIG. 10C). Further, an angle γ between the leaf springs 1004, 1006, 1100, 1102 is not 90°, like in the exemplary embodiment according to FIG. 10A, but 45°. Consequently, the leaf springs 1004, 1006, 1100 and 1102 form the shape of a star, when seen in cross section.

Figure 12A:
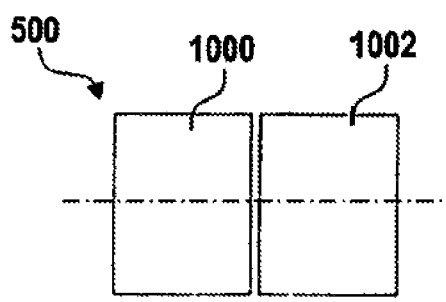
FIG. 12A shows a side view of a torsion-decoupling element according to an even further embodiment.
Figure 12B:
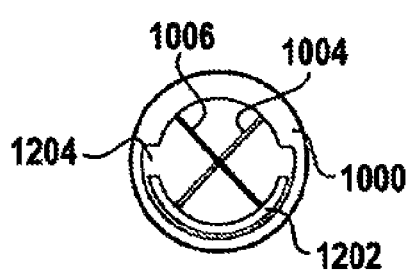
FIG. 12B shows an axial view from the left from FIG. 12A.
Figure 12C:
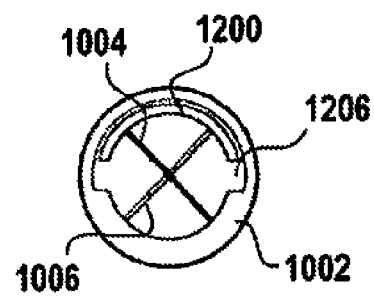
FIG. 12C shows an axial view from the right from FIG. 12A.

Below, a further embodiment of the torsion-decoupling element 500 is explained on the basis of FIGS. 12A to 12D. FIG. 12A shows the connection portions 1000, 1002 of the torsion-decoupling element 500. As becomes clear on the basis of the view of FIG. 12A, as shown from the left-hand side and right-hand side in FIGS. 12B and 12C, respectively, the connection portions 1000, 1002 are each embodied as hollow cylindrical portions.

Figure 12D:
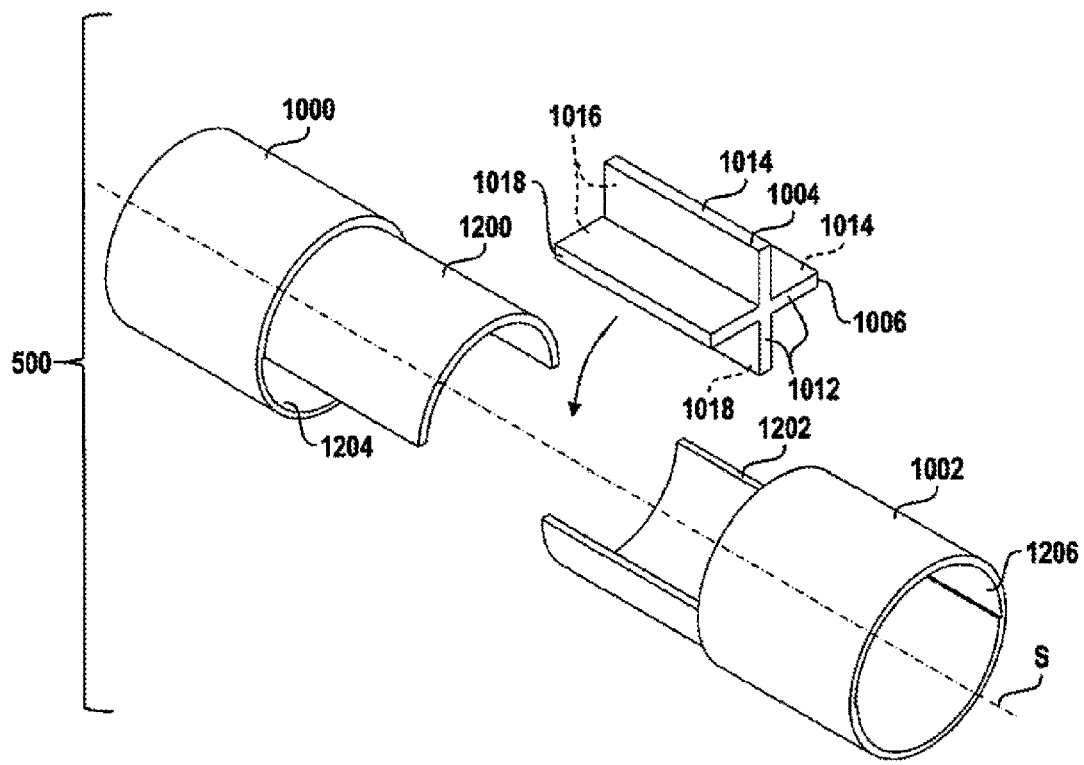
FIG. 12D shows an exploded view of the torsion-decoupling element from FIG. 12A.

FIG. 12D illustrates the torsion-decoupling element 500 from FIG. 12A in an exploded view. A tongue 1200, 1202 with a cross section in the shape of a partial circle is formed onto the hollow cylindrical connection portions 1000, 1002 in each case. The leaf springs 1004 and 1006 integrally form the shape of a cross. The leaf springs 1004, 1006 in each case connect both the two tongues 1200, 1202 and the hollow cylindrical connection portions 1000, 1002 to one another. To this end, the leaf springs 1004, 1006, at the long narrow sides 1014, 1018 thereof, are each connected to a tongue 1200, 1202 and a hollow cylindrical connection portion 1000, 1002. In contrast thereto, the connection to the connection portions 1000, 1002 is implemented via the short narrow sides 1012, 1016 in the exemplary embodiment from FIGS. 10A and 10B.

Accordingly, the leaf springs 1004, 1006 are bent (and not twisted, like in FIGS. 10A to 11) when the hollow cylindrical connection portions 1000, 1002 are twisted against one another about the axis S.

The hollow cylindrical connection portions 1000, 1002 each have a recess 1204, 1206 (see also FIGS. 12B and 12C), which allows the tongues 1200, 1202 to be pushed into the other hollow cylindrical connection portion 1000, 1002 in each case.

Figure 13:
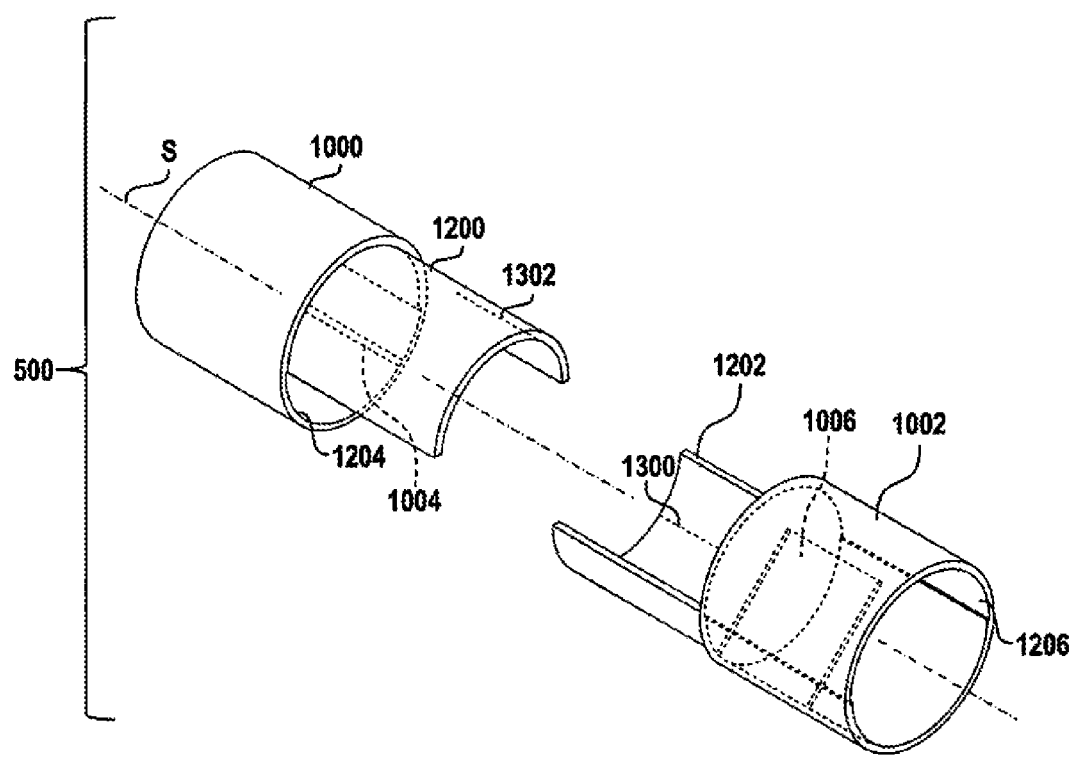
FIG. 13 shows the view from FIG. 12D, but according to an even further embodiment.

The exemplary embodiment according to FIG. 13 represents a variant of the torsion decoupling element 500 in relation to FIGS. 12A to 12D.

In the exemplary embodiment according to FIG. 13, the leaf springs 1004, 1006 do not extend parallel to one another and are also not, between them, connected to one another along the pin axis S either (see FIG. 12D); instead, they are arranged in succession along the axis S. Here, the leaf spring 1004 connects the hollow cylindrical connection portion 1000 to the tongue 1202, with the connection occurring on the tongue 1202 along a dashed line 1300 that is indicated for an improved understanding. The leaf spring 1006 connects the hollow cylindrical connection portion 1002 to the tongue 1200, with the connection occurring along the dashed line 1302 on the tongue 1200.

Although the disclosure has been described here on the basis of preferred exemplary embodiments, it is not in any way restricted to them but rather can be modified in a wide variety of ways.

LIST OF REFERENCE SIGNS

100A EUV lithography apparatus
100B DUV lithography apparatus
102 Beam shaping and illumination system
104 Projection system
106A EUV light source
106B DUV light source
108A EUV radiation
108B DUV radiation
110-118 Mirrors 120 Photomask
122 Mirror
124 Wafer
126 Optical axis
128 Lens element
130 Mirror
132 Immersion liquid
200 Bearing arrangement
202 Optical element
204 Base
206 Bearing device
208-1-208-9 Bearing units
210 Adapter
212 Bending decoupling element
214 Pin
216 Bending decoupling element
218 Pin
500 torsion-decoupling element
502 Pin
600 Adapter
602 Movable part
604 Stationary part
606 Leaf spring
608 Leaf spring
610 Connection portion
800-810 Sides
1000 Connection portion
1002 Connection portion
1004 Leaf spring
1006 Leaf spring
1008-1018 Side
1100 Leaf spring
1102 Leaf spring
1200 Tongue
1202 Tongue
1204 Recess
1206 Recess
1300 Connection region
1302 Connection region
α, β, γ Angles
$\sigma_{rs}$, $\sigma'_{rs}$ Torsional stress
E Plane of principal extent
G Gravity
K Force flow
$K_1$, $K_2$ Force flow
R Bending axis
S Pin axis
T Bending axis
TM Torsional moment
u1-u9 Actuators
X, Y, Z Axes

What is claimed is:

1. A bearing arrangement, comprising:
an optical element;
a base; and
a bearing device configured to movably mount the optical element relative to the base,
wherein:
the bearing device comprises a torsion-decoupling element configured to reduce a transmission of torsional moments between the optical element and the base;
the torsion-decoupling element comprises first and second leaf springs;
each of the first and second leaf springs has mutually opposing narrow sides;
the torsional moments act about an axis that is perpendicular to the narrow sides;
the first and second leaf springs are at an angle to each other;
the first and second leaf springs are mechanically connected in parallel;
the first and second leaf springs are coupled to each other so that a force flow through the torsion-decoupling element simultaneously flows through the first and second leaf springs;
the torsion-decoupling element comprises first and second hollow cylindrical portions;
a first tongue is defined at the first hollow cylindrical portion;
a second tongue is defined at the second hollow cylindrical portion;
the tongue protrudes into the second hollow cylindrical portion; and
the first tongue is connected to the second hollow cylindrical portion via the first and second leaf springs.

2. The bearing arrangement of claim 1, wherein the first and second leaf springs connect the same components of the bearing device to each other.

3. The bearing arrangement of claim 1, wherein the first and second leaf springs together form a cross-shaped cross-section.

4. The bearing arrangement of claim 1, wherein the torsion-decoupling element comprises further leaf springs, which together with the first and second leaf springs, form a star-shaped cross-section.

5. The bearing arrangement of claim 1, further comprising an actuator configured to actuate the optical element along the axis via the bearing device.

6. The bearing arrangement of claim 1, wherein the bearing device comprises a pin with a longitudinal central axis that defines the axis.

7. The bearing arrangement of claim 6, further comprising a first bending decoupling element,
wherein:
the pin is connected to the optical element via the first bending decoupling element;
the first bending decoupling element comprises two leaf springs having bending axes perpendicular to each other; and
a force flow through the first bending decoupling element flows in succession through the two leaf springs of the first bending decoupling element.

8. The bearing arrangement of claim 7, wherein the pin is movable along the axis via an actuator that is configured to actuate the optical element along the axis via the bearing device.

9. The bearing arrangement of claim 8, wherein:
the pin has first and second ends;
the first bending decoupling element is disposed at the first end of the pin; and
the second end of the pin is coupled to the actuator.

10. The bearing arrangement of claim 9, further comprising a second bending decoupling element coupling the second end of the pin to the actuator,
wherein:
the second bending decoupling element comprises two leaf springs having bending axes perpendicular to each other; and
a force flow through the second bending decoupling element flows in succession through the two leaf springs of the second bending decoupling element.

11. The bearing arrangement of claim 9, wherein the actuator comprises an actuator selected from the group consisting of a gravity compensator, a Lorentz actuator, and a reluctance actuator.

12. The bearing arrangement of claim 8, wherein the actuator comprises an actuator selected from the group consisting of a gravity compensator, a Lorentz actuator, and a reluctance actuator.

13. The bearing arrangement of claim 5, wherein the actuator comprises an actuator selected from the group consisting of a gravity compensator, a Lorentz actuator, and a reluctance actuator.

14. The bearing arrangement of claim 1, wherein:
the bearing device comprises a plurality of bearing units;
for each bearing unit, the bearing unit comprises:
   a pin;
   an actuator configured to actuate the pin along a longitudinal axis of the pin; and
   a torsion-decoupling element configured to decouple torsion about the longitudinal axis of the pin.

15. The bearing arrangement of claim 14, wherein the bearing device comprises between two and nine bearing units.

16. The bearing arrangement of claim 14, wherein the bearing device comprises between six and nine bearing units.

17. The bearing arrangement of claim 1, wherein the optical element comprises an optical element selected from the group consisting of a mirror, a lens element, a lambda plate, and an optical grating.

18. An apparatus, comprising:
an illumination system comprising a bearing arrangement according to claim 1; and
a projection system,
wherein the apparatus is a lithography apparatus.

19. The apparatus of claim 18, wherein the apparatus is a DUV lithography apparatus.

20. The apparatus of claim 18, wherein the apparatus is an EUV lithography apparatus.

* * * * *

UNITED STATES PATENT AND TRADEMARK OFFICE
CERTIFICATE OF CORRECTION

PATENT NO. : 10,386,732 B2
APPLICATION NO. : 16/181437
DATED : August 20, 2019
INVENTOR(S) : Pascal Marsollek Page 1 of 1

It is certified that error appears in the above-identified patent and that said Letters Patent is hereby corrected as shown below:

In the Specification

Column 3, Line 35, please after "case" insert -- . --.

Column 9, Line 38, please after "direction" insert -- . --.

Signed and Sealed this
Tenth Day of December, 2019

Andrei Iancu
*Director of the United States Patent and Trademark Office*